United States Patent
Cho et al.

(10) Patent No.: US 7,485,559 B2
(45) Date of Patent: Feb. 3, 2009

(54) SEMICONDUCTOR DEVICE AND METHOD OF FABRICATING THE SAME

(75) Inventors: Sung-Lae Cho, Gwacheon-si (KR); Horii Hideki, Seoul (KR)

(73) Assignee: Samsung Electronics Co., Ltd., Gyeonggi-do (KR)

(*) Notice: Subject to any disclaimer, the term of this patent is extended or adjusted under 35 U.S.C. 154(b) by 274 days.

(21) Appl. No.: 11/149,153

(22) Filed: Jun. 10, 2005

(65) Prior Publication Data

US 2006/0030108 A1    Feb. 9, 2006

(30) Foreign Application Priority Data

Aug. 4, 2004    (KR) .................. 10-2004-0061528

(51) Int. Cl.
*H01L 21/44*    (2006.01)
(52) U.S. Cl. .................. 438/597; 438/130; 438/385; 438/600
(58) Field of Classification Search .................. 438/281, 438/95, 130, 200, 241, 597, 637, 638, 639, 438/675, 676, 682, 683, 385, 600, 601
See application file for complete search history.

(56) References Cited

U.S. PATENT DOCUMENTS

| | | | |
|---|---|---|---|
| 3,271,591 A | | 9/1966 | Ovshinsky |
| 6,001,729 A | * | 12/1999 | Shinriki et al. .............. 438/625 |
| 6,649,928 B2 | | 11/2003 | Dennison |
| 6,696,355 B2 | | 2/2004 | Dennison |
| 6,955,979 B2 | * | 10/2005 | Akram ........................ 438/597 |
| 7,164,147 B2 | * | 1/2007 | Lee et al. ........................ 257/4 |
| 2003/0193063 A1 | | 10/2003 | Chiang et al. |
| 2005/0014324 A1 | * | 1/2005 | Williams et al. ............ 438/200 |
| 2005/0170533 A1 | * | 8/2005 | Lee et al. ........................ 438/3 |

FOREIGN PATENT DOCUMENTS

| | | |
|---|---|---|
| KR | 1020020050665 A | 6/2002 |
| KR | 1020020052566 A | 7/2002 |

OTHER PUBLICATIONS

Korean Office Action dated Jan. 6, 2006.

* cited by examiner

*Primary Examiner*—Kevin M Picardat
(74) *Attorney, Agent, or Firm*—Harness, Dickey & Pierce, P.L.C.

(57) ABSTRACT

A semiconductor device and methods thereof. The semiconductor device includes a first layer formed on a substrate, the first layer having a higher conductivity. The semiconductor device further includes a second layer formed on the first layer, the second layer including a hole exposing a portion of the first layer, the exposed portion of the first layer having a lower conductivity. The method includes forming a first layer on a substrate, the first layer having a higher conductivity, forming a second layer on the first layer, exposing a portion of the first layer by forming a hole in the second layer, performing a process on at least the exposed portion of the first layer, the process decreasing the conductivity of the exposed portion. The exposed portion including the lower conductivity or higher resistivity may block heat from conducting in the first layer.

15 Claims, 5 Drawing Sheets

SEMICONDUCTOR DEVICE AND METHOD OF FABRICATING THE SAME

PRIORITY STATEMENT

This application claims priority from Korean Patent Application No. 2004-61528, filed on Aug. 4, 2004, the disclosure of which is hereby incorporated herein by reference in its entirety as if set forth fully herein.

BACKGROUND OF INVENTION

1. Technical Field

Example embodiments of the present invention relate to a semiconductor device and method of fabricating the same, and more particularly to a semiconductor device including a higher resistivity region and method of fabricating the same.

2. Discussion of the Related Art

Unlike volatile memory devices, non-volatile memory devices may retain data stored in memory cells when its power supply is turned off. Non-volatile memory devices may be used in various electronic applications (e.g., computers, mobile communication systems, memory cards, etc.).

Flash memory devices may represent a class of non-volatile memory devices. Flash memory devices may include memory cells with a stacked gate structure. The stacked gate structure may include a tunnel oxide layer, a floating gate, an inter-gate dielectric layer and a control gate electrode. Each of the tunnel oxide layer, floating gate, inter-gate dielectric layer and control gate electrode may be stacked on a channel region. The reliability and efficiency of flash memory devices may increase by increasing a film quality of the tunnel oxide layer and/or a coupling ratio of the memory cells.

Another example of a non-volatile memory device may be a phase-change memory device. Phase-change memory devices may include a phase-change material capable of writing and/or erasing data. A unit cell of the phase-change memory device may include an access element and a data storage element serially connected to the access element. The data storage element may include a lower electrode electrically connected to the access element and a phase-change material layer in contact with the lower electrode.

The lower electrode may function as a heater (e.g., due to a higher conductivity or a lower resistivity). When a write current flows through the access element and the lower electrode, a given amount of heat, which may be interpreted in joules, may be generated between the phase-change material layer and the lower electrode. The given amount of heat may change the structure of the phase-change material layer into another type (e.g., an amorphous structure, a crystalline structure, etc.). The term "phase-change" may refer to any detectable change between two structures (e.g., between a fully crystallized structure and a fully amorphous structure). The phase-change material layer may include different electrical characteristics based on its structure. For example, an amorphous structure may include a higher resistance as compared to a crystalline structure.

A conventional phase-change memory device may require a higher current (e.g., a write current) in order to cause a phase-change (e.g., as compared to other devices). The size of address lines and/or an access device to transfer the current to each cell may be limited because of the heat induced by the higher current. The limited size and/or increased heat characteristics may increase the difficulty of integrating phase-change memory devices (e.g., into a larger semiconductor device). The higher current may be reduced by reducing a contact area between the lower electrode and the phase-change material layer. A transition metal (e.g., titanium, a nitride compound, etc.) may be used for the lower electrode. However, if the lower electrode includes a higher thermal conductivity, the lower electrode may function as a heat sink, and a phase change may be more difficult to detect.

Other lower electrodes may include a metal compound (e.g., metal nitride, refractory metal nitride, metal silicon nitride, refractory metal silicon nitride, etc.) having a higher resistance (e.g., as compared to titanium and/or the nitride compound). However, if the lower electrode includes a metal compound having a higher resistivity, a parasitic resistance of the lower electrode and a power level required to store data in the phase-change memory cell may be increased.

SUMMARY OF THE INVENTION

An example embodiment of the present invention is directed to a method of forming a semiconductor device, including forming a first layer on a substrate, the first layer having a higher conductivity, forming a second layer on the first layer, the second layer having a lower conductivity, exposing a portion of the first layer by forming a hole in the second layer and performing a process on at least the exposed portion of the first layer, the process decreasing the conductivity of the exposed portion.

Another example embodiment of the present invention is directed to a semiconductor device, including a first layer formed on a substrate, the first layer including a first portion with a first conductivity and a second portion with a second conductivity, the second conductivity being lower than the first conductivity and a second layer formed on the first layer, the second portion of the first layer in contact with the second layer.

Another example embodiment of the present invention is directed to a semiconductor device, including a conductive layer with a first portion and a second portion, the first portion having a first conductivity level and the second portion having a second conductivity level.

BRIEF DESCRIPTION OF THE DRAWINGS

The present invention will become more apparent by describing in detail example embodiments thereof with reference to the attached drawings in which.

It should be noted that these Figures are intended to illustrate the general characteristics of methods and devices of example embodiments of this invention, for the purpose of the description of such example embodiments herein. These drawings are not, however, to scale and may not precisely reflect the characteristics of any given embodiment, and should not be interpreted as defining or limiting the range of values or properties of example embodiments within the scope of this invention.

In particular, the relative thicknesses and positioning of layers or regions may be reduced or exaggerated for clarity. Further, a layer is considered as being formed "on" another layer or a substrate when formed either directly on the referenced layer or the substrate or formed on other layers or patterns overlaying the referenced layer. Further, a layer being formed "on" another layer may be formed on a portion of the other layer and/or an entirety of the other layer.

DETAILED DESCRIPTION OF THE EXAMPLE EMBODIMENTS OF THE INVENTION

Hereinafter, example embodiments of the present invention will be described in detail with reference to the accompanying drawings.

In the Figures, the same reference numerals are used to denote the same elements throughout the drawings.

FIGS. 1 to 5 are sectional views illustrating a process of forming data storage elements of a phase change memory cell according to an example embodiment of the present invention.

Figure 1:
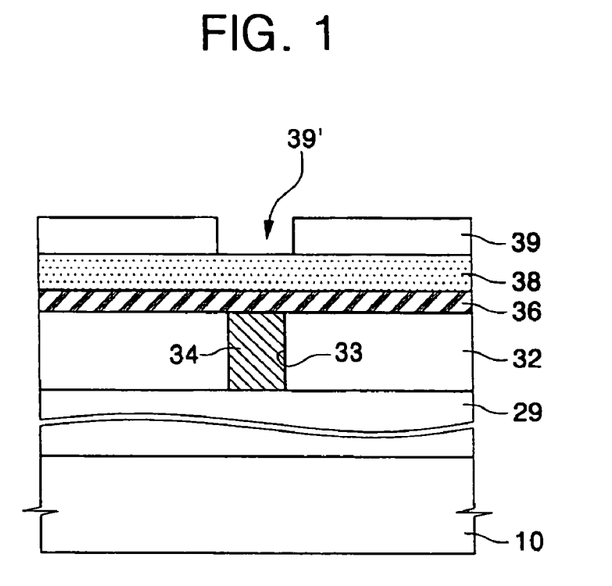
FIGS. 1 to 5 are sectional views illustrating a process of forming data storage elements of a phase change memory device according to an example embodiment of the present invention.

In the example embodiment of FIG. 1, an interlayer insulating layer 32 may be formed on a semiconductor substrate 10. The interlayer insulating layer 32 may include a silicon oxide layer and/or a silicon oxynitride layer. A lower interlayer insulating layer 29 may be formed between a semiconductor substrate 10 and the interlayer insulating layer 32. An access element (e.g., an access MOS transistor), upon which the lower interlayer insulating layer 29 may be formed, may be formed on the semiconductor substrate 10. The interlayer insulating layer 32 may be patterned to form a lower electrode contact hole 33. The lower electrode contact hole 33 may be formed to expose a conductive contact pad (not shown) in the lower interlayer insulating layer 29. A conductive layer may be formed on the interlayer insulating layer 32 and may fill the lower electrode contact hole 33. For example, the conductive layer may include titanium nitride (TiN), titanium aluminum nitride (TiAlN), etc. The conductive layer may be planarized to expose the upper surface of the interlayer insulating layer 32. After the conductive layer is planarized, a lower electrode contact plug 33 may remain in the lower electrode contact hole 33.

In the example embodiment of FIG. 1, a lower conductive layer 36 and a molding insulating layer 38 may be formed on the lower electrode contact plug 33 and the interlayer insulating layer 32. In an example, the molding insulating layer 38 may include at least one of silicon oxide, silicon nitride and silicon oxynitride. The lower conductive layer 36 may include a transition metal having a relatively low resistivity. In an example, the transition metal may include at least one of titanium (Ti), zirconium (Zr), hafnium (Hf), vanadium (V), niobium (Nb) and tantalum (Ta). The lower conductive layer 36 may include a higher solid solubility with respect to nitrogen. The higher solid solubility may achieve a higher resistivity during the formation of nitride.

In another example embodiment of the present invention, referring to FIG. 1, the lower conductive layer 36 may include hafnium (Hf), niobium (Nb) and/or tantalum (Ta). The combination of the hafnium, niobium, tantalum and/or nitrogen may be applied according to a stoichiometric ratio of 1:1 or greater to form nitride. For example, tantalum may provide a resistivity of about $10^{11}$ $\mu\Omega\cdot cm$. In this example, the stoichiometric ratio between tantalum and nitrogen may be increased up to 1:1.67 in the formation of tantalum nitride.

In the example embodiment of FIG. 1, a mask pattern 39 having an opening 39' may be formed on the molding insulating layer 38 to expose a portion of the molding insulating layer 38 through the opening 39'. The opening 39' may overlap the lower electrode contact plug 34. For example, the mask pattern 39 may be a photo-resist pattern.

Figure 2:
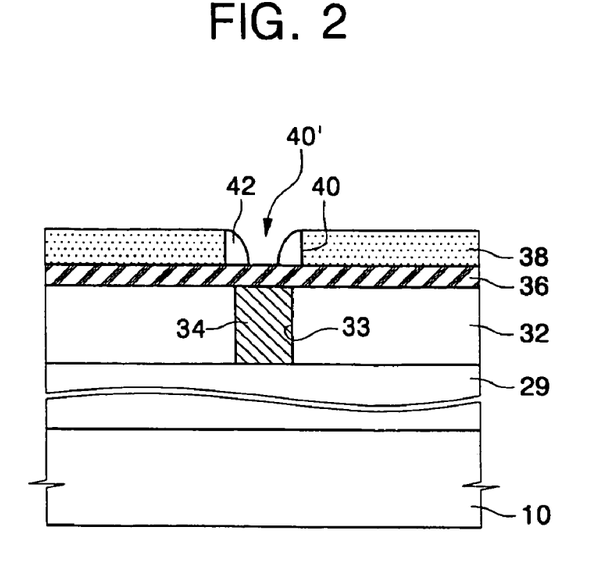

In the example embodiment of FIG. 2, the molding insulating layer 38 may be etched (e.g., using the mask pattern 39 as an etch mask), thereby forming a via hole 40 exposing a portion of the lower conductive layer 36. In an example, the molding insulating layer 38 may be etched using a plasma dry etch process. The mask pattern 39 may be removed and via hole spacers 42 may be formed on the sidewalls of the via hole 40.

An example process of forming the via hole spacers 42 will now be described with reference to FIG. 2. A spacer insulating layer may be formed on the molding insulating layer 38 having the via hole 40 and the portion of the lower conductive layer 36 exposed by the via hole 40. The spacer insulating layer may have an etch selectivity relative to the molding insulating layer 38. For example, if the molding insulating layer 38 includes a silicon oxide layer, the spacer insulating layer may include silicon nitride (e.g., a silicon nitride layer). The spacer insulating layer may be etched (e.g., anisotropically etched) to form the via hole spacers 42 on the sidewalls of the via hole 40. The via hole 40 may include sloped sidewalls (e.g., the via hole spacers 42). An exposed portion of the via hole 40 may be illustrated by an exposed via hole 40'.

Figure 3:
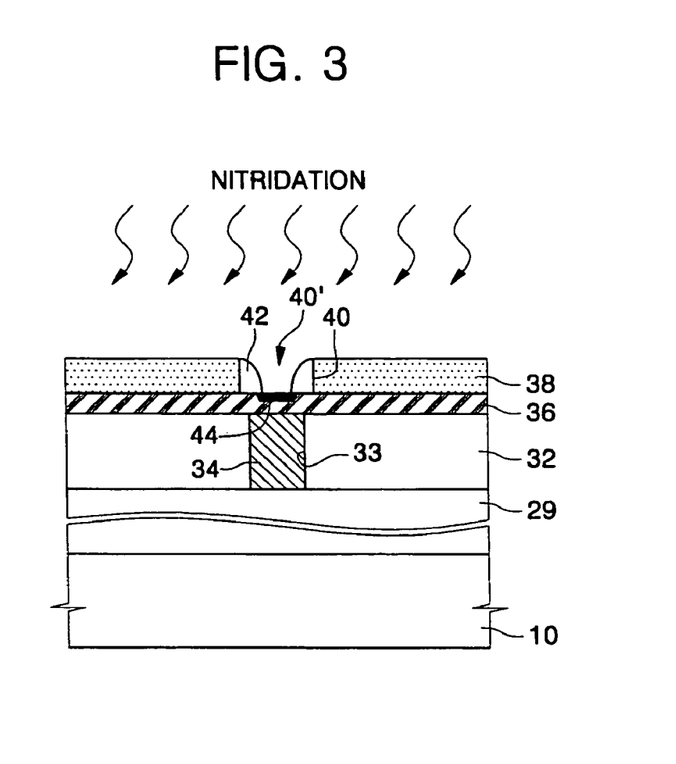

In the example embodiment of FIG. 3, a nitridation process may be performed on the exposed via hole 40' (e.g., the exposed portion of the lower conductive layer 36 exposed in the via hole 40). For example, the nitridation process may include one or more of a rapid thermal nitridation process, a plasma nitridation process and a radical nitridation process. The nitridation process may be performed in a given atmosphere including at least one type of gas (e.g., a nitrogen gas (e.g., $N_2$), ammonia ($NH_3$), hydrazine ($N_2H_4$), etc.). A higher resistivity region (e.g, a region having a lower conductivity) may be formed in the exposed via hole 40'.

In the example embodiment of FIG. 3, the higher resistivity region may include a metal nitride layer 44 (e.g., including a metal of the lower conductive layer 36). In an example, if the lower conductive layer 36 includes a transition metal, the metal nitride layer 44 may be a transition metal nitride layer. In an example, the transition metal nitride layer may include one or more of a hafnium nitride layer, a niobium nitride layer and a tantalum nitride layer. As shown in the example embodiment of FIG. 3, the metal nitride layer 44 may be formed in an upper portion of the lower conductive layer 36 at the exposed via hole 40'. The thickness of the metal nitride layer 44 and a content level of the nitrogen in the metal nitride layer 44 may be controlled through characteristics (e.g., temperature, time, chamber pressure, plasma power, etc.) of the nitridation process.

Figure 4:
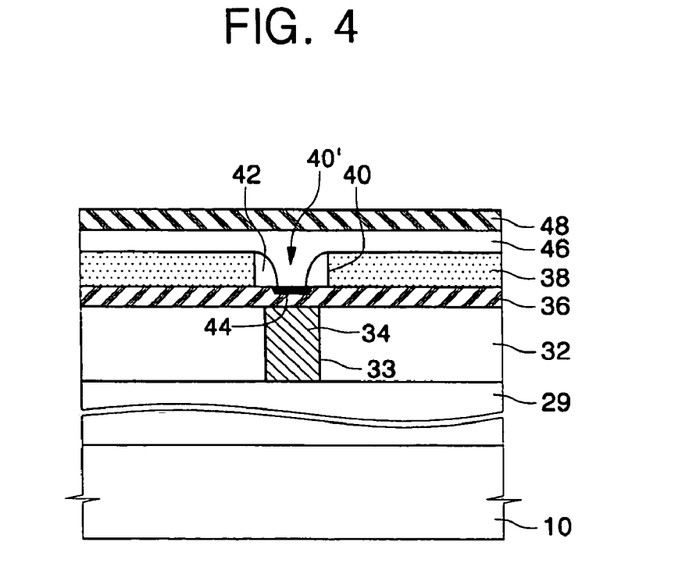

In the example embodiment of FIG. 4, a phase-change material layer 46 may be formed on the molding insulating layer 38 to fill the exposed via hole 40'. The phase-change material layer 46 may be formed to fill the exposed via hole 40' and/or rise to a given height above the upper surface of the molding insulating layer 38.

In another example embodiment of the present invention, referring to FIG. 4, the phase-change memory device 46 may include phase-change material having a crystalline structure that may vary in accordance with a heat generated by a current applied to the phase-change material. Phase-change material employed for the phase-change memory device may include a chalcogenide material or alloy, for example, such as germanium-antimony-tellurium (Ge—Sb—Te, also referred to as 'GST'). Phase-change material such as GST may have a crystalline structure that varies according to a heat caused by an amount and time of a current applied thereto. In general, amorphous GST has a relatively high specific resistance, whereas crystalline GST has a relatively low specific resistance. Due to the resistance variation properties of GST, a phase-change memory device including GST may store data therein. For example, the phase-change material layer 46 may include an alloy layer including at least one of germanium (Ge), stibium (Sb), and tellurium (Te) (e.g., Te$_x$Sb$_y$Ge$_{(100-(x+y))}$) (e.g., a GST alloy layer). In this example, a variable "x" may range, from 20 to 80, and a variable "y" may range from 5 to 50. At given concentrations of atomic weight, the GST alloy layer may include tellurium (Te) (e.g., between 20% and 80%), stibium (Sb) (e.g., between 5% and 50%) and germanium (Ge) (e.g., between 0% and 75). Further, the GST alloy layer may be doped with at least one of nitrogen and silicon.

In another example embodiment of the present invention, with reference to FIG. 4, the phase-change layer pattern 46 may include a chalcogenide layer. The chalcogenide layer may include chalcogenide alloys such as germanium-antimony-tellurium (Ge—Sb—Te), arsenic-antimony-tellurium (As—Sb—Te), tin-antimony-tellurium (Sn—Sb—Te), or tin-indium-antimony-tellurium (Sn—In—Sb—Te), arsenic-germanium-antimony-tellurium (As—Ge—Sb—Te). Alternatively, the phase-change layer pattern 46 may include an element in Group VA-antimony-tellurium, for example, tantalum-antimony-tellurium (Ta—Sb—Te), niobium-antimony-tellurium (Nb—Sb—Te) or vanadium-antimony-tellurium (V—Sb—Te) or an element in Group VA-antimony-selenium, for example, tantalum-antimony-selenium (Ta—Sb—Se), niobium-antimony-selenium (Nb—Sb—Se) or vanadium-antimony-selenium (V—Sb—Se). Further, the phase-change layer pattern 46 may include an element in Group VIA-antimony-tellurium, for example, tungsten-antimony-tellurium (W—Sb—Te), molybdenum-antimony-tellurium (Mo—Sb—Te), or chrome-antimony-tellurium (Cr—Sb—Te) or an element in Group VIA-antimony-selenium, for example, tungsten-antimony-selenium (W—Sb—Se), molybdenum-antimony-selenium (Mo—Sb—Se) or chrome-antimony-selenium (Cr—Sb—Se).

Although the phase-change layer pattern 46 may be formed primarily of ternary phase-change chalcogenide alloys, the chalcogenide alloy of the phase-change layer pattern 46 could also be selected from a binary phase-change chalcogenide alloy or a quarternary phase-change chalcogenide alloy. Example binary phase-change chalcogenide alloys may include one or more of Ga—Sb, In—Sb, In—Se, Sb2—Te3 or Ge—Te alloys; example quarternary phase-change chalcogenide alloys may include one or more of an Ag—In—Sb—Te, (Ge—Sn)—Sb—Te, Ge—Sb—(Se—Te) or Te81-Ge15—Sb2-S2 alloy.

In the example embodiment of FIG. 4, the phase-change material layer 46 may be in contact with the metal nitride layer 44 through the exposed via hole 40'. An upper conductive layer 48 may be formed on the phase-change material layer 46. The upper conductive layer 48 may include a chemically stable material layer (e.g., a titanium nitride layer) which may not chemically react with the phase-change material layer 46.

Figure 5:
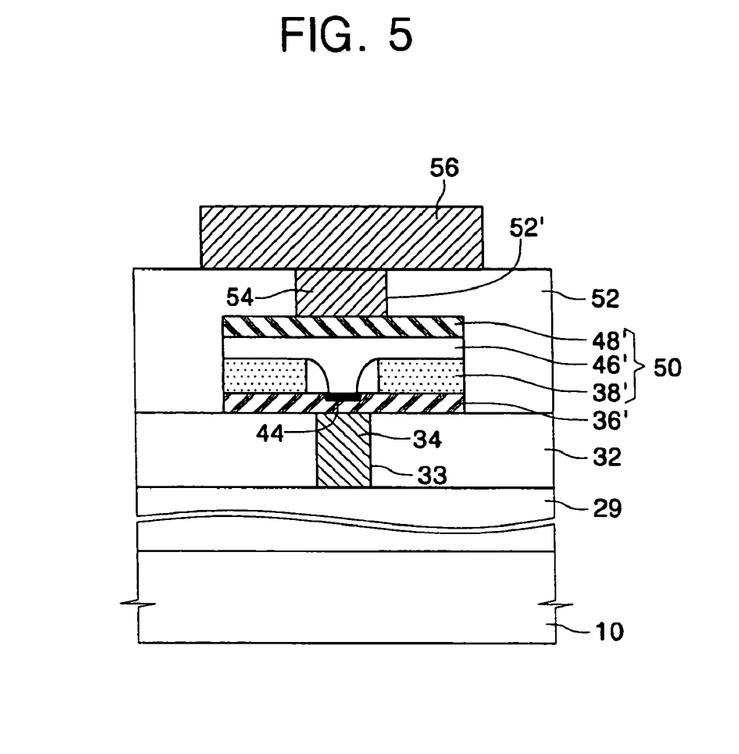

In the example embodiment of FIG. 5, the upper conductive layer 48, the phase-change material layer 46, the molding insulating layer 38, and the lower conductive layer 36 may be patterned (e.g., sequentially patterned) to form a data storage element 50. The data storage element 50 may include a patterned lower electrode 36' covering the lower electrode contact plug 34, a patterned molding insulating layer 38' formed on the patterned lower electrode 36', a patterned phase-change material layer 46' filling the exposed via hole 40' and/or a patterned upper electrode 48' formed on the patterned phase-change material layer 46'. The patterned phase-change material layer 46' may be in contact with the metal nitride layer 44, which may be formed as a portion of the lower electrode 36', through the exposed via hole 40'.

In the example embodiment of FIG. 5, the patterned lower electrode 36' may include a transition metal layer having a lower resistivity. The portion of the patterned lower electrode 36' in contact with the patterned phase-change material layer 46' may include the metal nitride layer 44 (e.g, having a higher resistivity). In the above-given example, a parasitic resistance which may be caused by a conventional lower electrode having a higher resistivity may be reduced and/or prevented. Further, a thickness of the patterned lower electrode 36' need not be reduced to achieve the lower parasitic resistance. By enabling the patterning lower electrode 36' to be formed at a higher thickness, an effectiveness of a subsequent etching and/or cleaning process may be increased. The metal nitride layer 44 may reduce and/or prevent the heat generated in the patterned phase-change material layer pattern 46' from being leaked to the patterned lower electrode 36' (e.g., because of a higher resistivity characteristic).

In the example embodiment of FIG. 5, an upper interlayer insulating layer 52 may be formed on (e.g, covering) the data storage element 50. The upper interlayer insulating layer 52 may be patterned to form a plate line contact hole 52' exposing at least a portion of the patterned upper electrode 48'. An upper electrode contact plug 54 may be formed in the plate line contact hole 52'. The upper electrode contact plug 54 may include a first metal layer (e.g., a tungsten layer). A second metal layer (e.g., an aluminum layer, a tungsten layer, etc.) may be formed on the upper electrode contact plug 54 and the upper interlayer insulating layer 52. The second metal layer may be patterned to form a plate line 56 covering the upper electrode contact plug 54.

FIGS. 6 to 9 are sectional views illustrating a process of forming a phase change memory device according to another example embodiment of the present invention.

Figure 6:
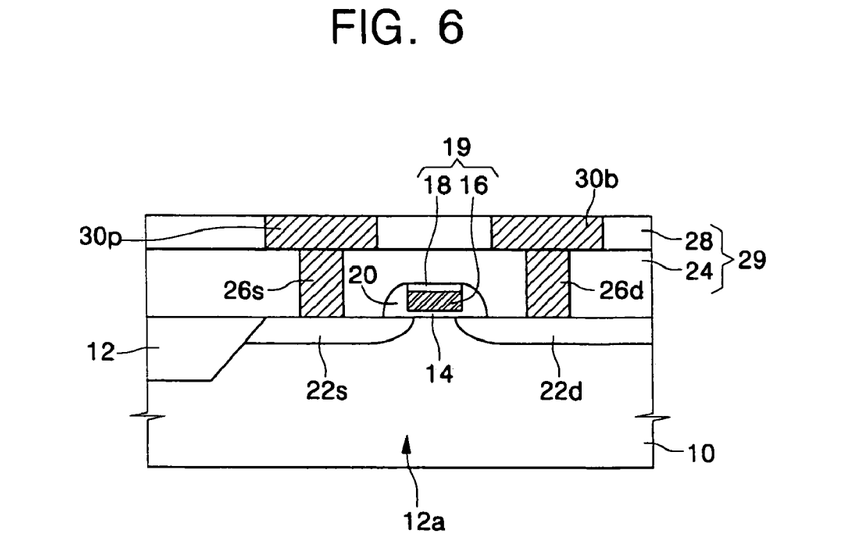
FIGS. 6 to 9 are sectional views illustrating a process of forming a phase change memory device according to another example embodiment of the present invention.

In the example embodiment of FIG. 6, a device isolation layer 12 may be formed in a portion of the semiconductor substrate 10 to define an active region 12a. A gate insulating layer 14 may be formed on the active region 12a. A gate conductive layer (not shown) and a capping layer (not shown) may be formed (e.g., sequentially formed) on the semiconductor substrate 10 having the gate insulating layer 14 (e.g., the gate conductive layer and the capping layer may be formed on both the semiconductor substrate 10 and the gate insulating layer 14). In an example, the gate conductive layer may be formed by sequentially stacking a doped polysilicon layer and a metal silicide layer. In another example, the capping layer may include an insulating layer (e.g., a silicon oxide layer, a silicon nitride layer, a silicon oxynitride layer, etc.).

In the example embodiment of FIG. 6, the capping layer and the gate conductive layer may be patterned to form a gate pattern 19 (e.g., a word line of a memory device). The gate pattern 19 may extend across the active region 12a. The gate pattern 19 may include a gate electrode 16 and a capping layer pattern 18 (e.g., the gate electrode 16 and the capping layer pattern 18 may be sequentially stacked). Gate spacers 20 may be formed to cover the sidewalls of the gate pattern 19. The gate spacers 20 may include an insulating layer (e.g., a silicon oxide layer, a silicon nitride layer, a silicon oxynitride layer, etc.). The gate spacers 20 and the gate pattern 19 may function as an ion implantation mask. The ion implantation mask may implant impurity ions into the active region 12a to form a drain region 22d and a source region 22s. A channel region (not shown) may be defined under the gate electrode 16 between the drain region 22d and the source region 22s.

In the example embodiment of FIG. 6, a first interlayer insulating layer 24 may be formed on the semiconductor substrate 10 having the drain region 22d and the source region 22s. The first interlayer insulating layer 24 may include a flat upper surface (e.g., achieved through planarization). A drain contact plug 26d and a source contact plug 26s may be formed in the first interlayer insulating layer 24. The drain contact plug 26d and the source contact plug 26s may be in contact with at least a portion of the drain region 22d and the source region 22s, respectively, through the first interlayer insulating layer 24. The drain contact plug 26d and the source contact plug 26s may be formed by any well-known process (e.g., a damascene process).

In the example embodiment of FIG. 6, a second interlayer insulating layer 28 may be formed on the drain/source contact plugs 26d/26s and the first interlayer insulating layer 24. The first and second interlayer insulating layers 24/28 may collectively form a lower interlayer insulating layer 29. A source pad 30p and a bit line 30b may be formed inside the second interlayer insulating layer 28 using any well-known process (e.g., a damascene process). The source pad 30p may be in contact with the source contact plug 26s. The bit line 30b may be in contact with the drain contact plug 26d. Referring to FIG. 6, it is understood that only a portion of the bit line 30b may be illustrated in order to clearly show an example position of the source pad 30p. However, it is understood that the bit line 30b may be formed to extend across a larger portion (e.g., an entirety) of the gate pattern 19.

Figure 7:
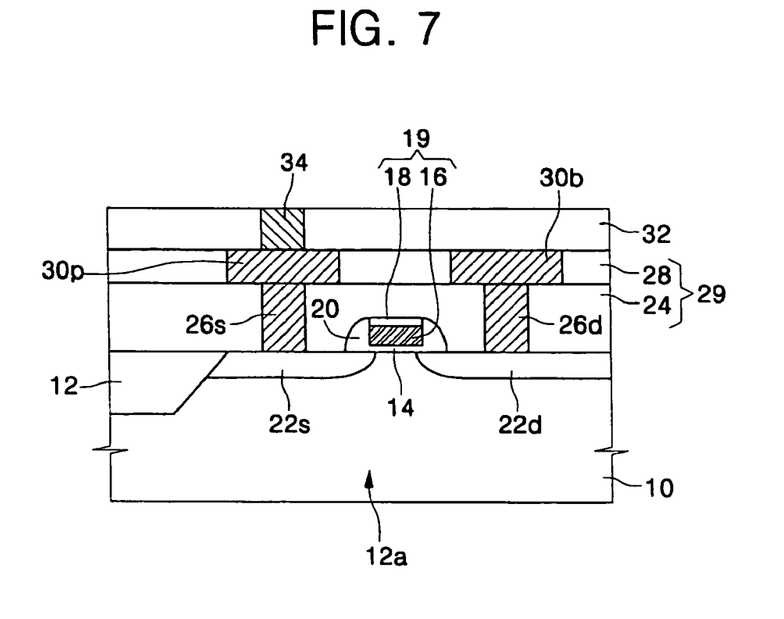

In the example embodiment of FIG. 7, a third interlayer insulating layer 32 (e.g., a metal interlayer insulating layer) may be formed to cover the second interlayer insulating layer 28, the source pad 30p and/or the bit line 30b. A lower electrode contact plug 34 may be formed in the third interlayer insulating layer 32. The lower electrode contact plug 34 may be formed with any well-known process (e.g., a damascene process).

Figure 8:
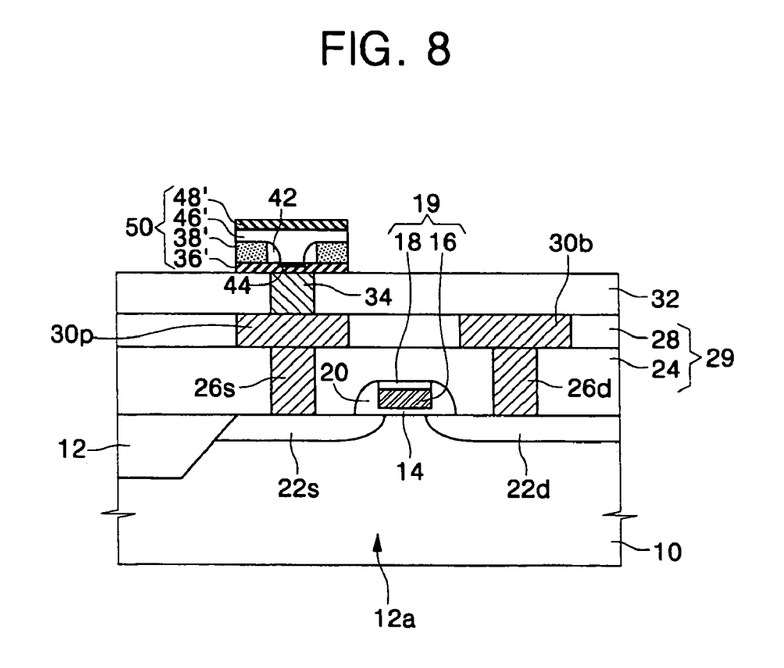

In the example embodiment of FIG. 8, the data storage element 50 of FIG. 5 may be formed on the third interlayer insulating layer 32. The data storage element 50 may be formed to cover the lower electrode contact plug 34. As discussed above with reference to the example embodiment of FIG. 5, the data storage element 50 may include the patterned lower electrode 36' covering the lower electrode contact plug 34, the patterned molding insulating layer 38' stacked on the patterned lower electrode 36', the patterned phase-change material layer 46' filling the exposed via hole 40' and the patterned upper electrode 48' stacked on the patterned phase-change material layer 46'. The patterned phase-change material layer 46' may be in contact with the metal nitride layer 44, which may be formed in the lower electrode 36', through the exposed via hole 40'. The formation of the data storage element 50, described above with reference to FIGS. 1-5, will not be discussed further for the sake of brevity.

Figure 9:
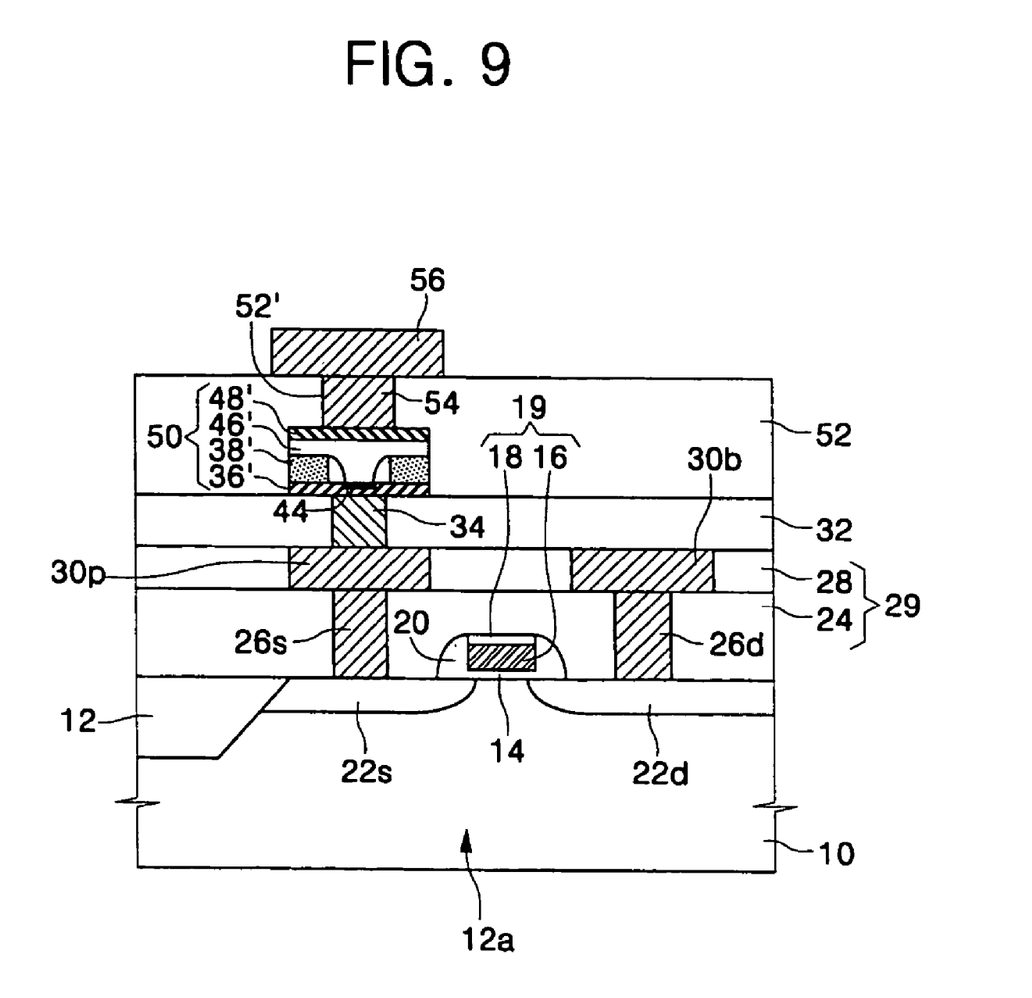

In the example embodiment of FIG. 9, as discussed above with reference to FIG. 5, the upper interlayer insulating layer 52 may be formed on the third interlayer insulating layer 32 (e.g., to cover the data storage element 50). The upper interlayer insulating layer 52 may be patterned to form the plate line contact hole 52' exposing the patterned upper electrode 48'. The upper electrode contact plug 54 may be formed in the plate line contact hole 52'. The upper electrode contact plug 54 may include a first metal layer (e.g., including tungsten). A second metal layer (e.g., an aluminum layer, a tungsten layer, etc.) may be formed on the upper electrode contact plug 54 and the upper interlayer insulating layer 52. The second metal layer may be patterned to form the plate line 56 on the upper electrode contact plug 54. In an example, the plate line 56 may be parallel with the gate pattern 19.

In another example embodiment of the present invention, forming a higher resistivity region in a contact region of a conductive layer may reduce a capacity of the conductive layer to function as a heat sink (e.g., due to the lower conductivity in the contact region). The lower conductivity in the contact region may reduce or suppress a parasitic resistance of the conductive layer.

The example embodiments of the present invention being thus described, it will be obvious that the same may be varied in many ways. For example, while above-given example embodiments employ a nitridation process to isolate a region having a higher resistivity, any well-known method of forming a higher resistivity region may be employed. Further, the data storage element 50 and/or variations thereof may be employed in any type of semiconductor device (e.g., a semiconductor memory device). Further, in the above-described examples employing the nitridation process, it is understood that conductive materials including nitrogen (N) may include titanium nitride (TiN), tantalum nitride (TaN), molybdenum nitride (MoN), niobium nitride (NbN), titanium-silicon nitride (TiSiN), titanium-aluminum nitride (TiAlN), titanium-boron nitride (TiBN), zirconium-silicon nitride (ZrSiN), tungsten-silicon nitride (WSiN), tungsten-boron nitride (WBN), zirconium-aluminum nitride (ZrAlN), molybdenum-silicon nitride (MoSiN), molybdenum-aluminum nitride (MoAlN), tantalum-silicon nitride (TaSiN), tantalum-aluminum nitride (TaAlN), titanium oxynitride (TiON), titanium-aluminum oxynitride (TiAlON), tungsten oxynitride (WON), tantalum oxynitride (TaON), etc.

Such variations are not to be regarded as departure from the spirit and scope of the example embodiments of the present invention, and all such modifications as would be obvious to one skilled in the art are intended to be included within the scope of the following claims.

What is claimed is:

1. A method of forming a semiconductor device, comprising:
   forming a first layer on a substrate;
   forming a second layer on the first layer, the second layer having a lower conductivity than the first layer;
   exposing a portion of the first layer by forming a hole in the second layer;
   performing a process on at least the exposed portion of the first layer, the process decreasing conductivity of the exposed portion; and
   filling the hole with a phase-change material layer.

2. The method according to claim 1, wherein the first layer is a conductive layer, the substrate is a semiconductor substrate, the second layer is a molding insulating layer and the hole is a via hole.

3. The method according to claim 2, wherein the conductive layer includes a transition metal layer.

4. The method according to claim 2, wherein the conductive layer includes at least one of a titanium (Ti) layer, a zirconium (Zr) layer, a hafnium (Hf) layer, a vanadium (V) layer, a niobium (Nb) layer and a tantalum (Ta) layer.

5. The method according to claim 2, wherein the conductive layer includes at least one of a hafnium (Hf) layer, a niobium (Nb) layer and a tantalum (Ta) layer.

6. The method according to claim 1, wherein the process is a nitridation process.

7. The method according to claim 6, wherein the nitridation process is performed by at least one of a rapid thermal nitridation process, a plasma nitridation process and a radical nitridation process.

8. The method according to claim 6, wherein the nitridation process is performed in an atmosphere including at least one of a nitrogen gas, an ammonia gas and a hydrazme gas.

9. The method according to claim 2, wherein forming the via hole includes patterning the molding insulating layer to form a preliminary via hole, exposing the conductive layer and forming via hole spacers covering sidewalls of the preliminary via hole.

10. The method according to claim 1, wherein the phase-change material layer includes a chalcogenide layer.

11. The method of claim 2, further comprising:
forming an interlayer insulating layer on the semiconductor substrate; and
forming a lower electrode contact plug through the interlayer insulating layer,
wherein the conductive layer is a lower conductive layer formed on the interlayer insulating layer including the lower electrode contact plug.

12. The method according to claim 11, further comprising:
forming an access MOS transistor on the semiconductor substrate, the access MOS transistor including a source region, a drain region, and a gate electrode on a channel region between the source region and the drain region;
forming a lower interlayer insulating layer on the semiconductor substrate having the access MOS transistor; and
forming a contact pad in the lower interlayer insulating layer, the contact pad electrically connected to at least one of the source region and the lower electrode contact plug.

13. The method according to claim 11, further comprising:
forming an upper conductive layer on at least the phase-change material layer; and
patterning the upper conductive layer, the phase-change material layer, the molding insulating layer, and the lower conductive layer to form a data storage element.

14. The method according to claim 13, wherein the data storage element includes a lower electrode on the lower electrode contact plug, a patterned molding insulating layer stacked on the lower electrode, a patterned phase-change material layer filling the via hole and an upper electrode, the lower electrode including the lower conductive layer.

15. The method according to claim 13, further comprising:
forming an upper interlayer insulating layer on the semiconductor substrate having the data storage element; and
forming a plate line on the upper interlayer insulating layer, the plate line electrically connected to the upper electrode.

* * * * *